US009773494B2

(12) United States Patent
Kwan

(10) Patent No.: US 9,773,494 B2
(45) Date of Patent: Sep. 26, 2017

(54) ACTIVE NOISE REDUCTION SYSTEM FOR CREATING A QUIET ZONE

(71) Applicant: Applied Research LLC., Rockville, MD (US)

(72) Inventor: Chiman Kwan, Rockville, MD (US)

(73) Assignee: APPLIED RESEARCH LLC., Rockville, MD (US)

( * ) Notice: Subject to any disclaimer, the term of this patent is extended or adjusted under 35 U.S.C. 154(b) by 0 days.

(21) Appl. No.: 15/206,895

(22) Filed: Jul. 11, 2016

(65) Prior Publication Data

US 2017/0053640 A1 Feb. 23, 2017

Related U.S. Application Data

(60) Provisional application No. 62/207,407, filed on Aug. 20, 2015.

(51) Int. Cl.

| | |
|---|---|
| ***G10K 11/16*** | (2006.01) |
| ***H03B 29/00*** | (2006.01) |
| ***G10K 11/178*** | (2006.01) |
| *G10K 11/00* | (2006.01) |

(52) U.S. Cl.

CPC ........ *G10K 11/1784* (2013.01); *G10K 11/002* (2013.01); *G10K 11/178* (2013.01); *G10K 2210/1081* (2013.01); *G10K 2210/128* (2013.01); *G10K 2210/3028* (2013.01); *G10K 2210/3216* (2013.01)

(58) Field of Classification Search

CPC . G10K 11/178; G10K 11/1784; G10K 11/002

USPC ..................... 381/71.11, 71.6, 58, 71.4, 71.8

See application file for complete search history.

(56) References Cited

U.S. PATENT DOCUMENTS

| | | | | |
|---|---|---|---|---|
| 2003/0108214 A1* | 6/2003 | Brennan | ............ | H03H 17/0266 381/94.7 |
| 2010/0124336 A1* | 5/2010 | Shridhar | ............ | G10K 11/1782 381/71.4 |
| 2011/0305347 A1* | 12/2011 | Wurm | ................. | G10K 11/178 381/71.1 |
| 2012/0170766 A1* | 7/2012 | Alves | ................ | G10K 11/1784 381/71.11 |
| 2013/0182865 A1* | 7/2013 | Paul | ..................... | G10K 11/178 381/71.8 |
| 2014/0072135 A1* | 3/2014 | Bajic | ................. | G10K 11/1784 381/71.11 |

(Continued)

*Primary Examiner* — Vivian Chin
*Assistant Examiner* — Ubachukwu Odunukwe
(74) *Attorney, Agent, or Firm* — WPAT, PC

(57) ABSTRACT

The present invention provides a system to create a quiet zone by suppressing background noise near a user's head. The present invention utilizes two microphones; one microphone receives environmental noise and the other one is located close to a person's head. A parabolic dish loudspeaker creates a uniform sound field near a user's head. A high performance frequency-domain filtered-x least mean square with band selection (FD-FX-LMS-BS) algorithm is utilized to generate the anti-phase noise signals. The algorithm has high noise reduction performance and also allows selection of specific frequency bands for noise reduction. The FD-FX-LMS-BS algorithm is performed by a field programmable gate array (FPGA) chip, which has minimal delay in algorithm processing.

2 Claims, 4 Drawing Sheets

(56) References Cited

U.S. PATENT DOCUMENTS

2016/0195856 A1* 7/2016 Spero .................... G06N 5/046
700/90

* cited by examiner

Frequency spectrum before (signal (d)) and after filtering (signal e(n))

Noise residue, noise, and control signals

ACTIVE NOISE REDUCTION SYSTEM FOR CREATING A QUIET ZONE

BACKGROUND OF THE INVENTION

Most conventional approaches to noise reduction focus on reducing noise at the source of the noise, either passively or actively. For example, some automobile manufacturers develop passive and active approaches to minimizing sounds in the engines and mufflers. Some conventional approaches focus on noise reduction at the receiver using headset, which may be inconvenient to the user or an occupant in a confined space.

In the prior art, as shown in the reference, WO 2014051883 A1, noise reduction is done at the source of the noise.

In U.S. Pat. No. 7,543,452 B2, a serrated nozzle trailing edge for exhaust noise suppression is disclosed. The noise reduction is also focused at the source of the noise.

In U.S. Patent Application Publication No. 2007/0223714 A1, an open-air noise cancellation system for a large open area coverage application is disclosed.

Further, in U.S. Pat. No. 5,182,774 A, a noise cancellation headset for noise reduction is disclosed.

However, in the field of noise reduction, none of the noise reduction methods directly reduces noise at the receiver-side to create a quite zone without necessitating the use of a headset. Therefore, it is a goal of the present invention to provide a system for noise reduction achieved at the receiver, using a parabolic dish to create a quiet zone without necessitating the use of a headset.

SUMMARY OF THE INVENTION

In an embodiment of the present invention, a system is provided to create a quiet zone by suppressing background noise near a user's head, while simultaneously allowing for high quality communication between the user and other people by allowing speech to pass through. The system comprises two microphones, a first microphone to receive environmental noise and a second microphone located near the user's head. The system further comprises a parabolic dish loudspeaker to create a uniform sound field near the user's head.

In an embodiment, the system employs a high performance frequency-domain filtered-x least mean square with band selection (FD-FX-LMS-BS) algorithm to generate the anti-phase noise signals.

In an embodiment, the system comprises a field programmable gate array (FPGA) chip, configured to perform the FD-FX-LMS-BS.

In an embodiment, the system creates a small quiet zone where specific audio bands below 500 Hz are significantly attenuated.

It is to be understood that both the forgoing general description and the following detailed description are exemplary and explanatory and are not restrictive of the invention, as claimed.

BRIEF DESCRIPTION OF THE DRAWINGS

The above embodiments become more readily apparent to those ordinarily skilled in the art after reviewing the following detailed description and accompanying drawings, in which.

DETAIL DESCRIPTION OF THE INVENTION

Aspects, features and advantages of several exemplary embodiments of the present invention will become better understood with regard to the following description in connection with the accompanying drawings. It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute terms, such as, for example, "will," "will not," "shall," "shall not" "must," and "must not," are not meant to limit the scope of the present invention as the embodiments disclosed herein are merely exemplary.

Figure 1:
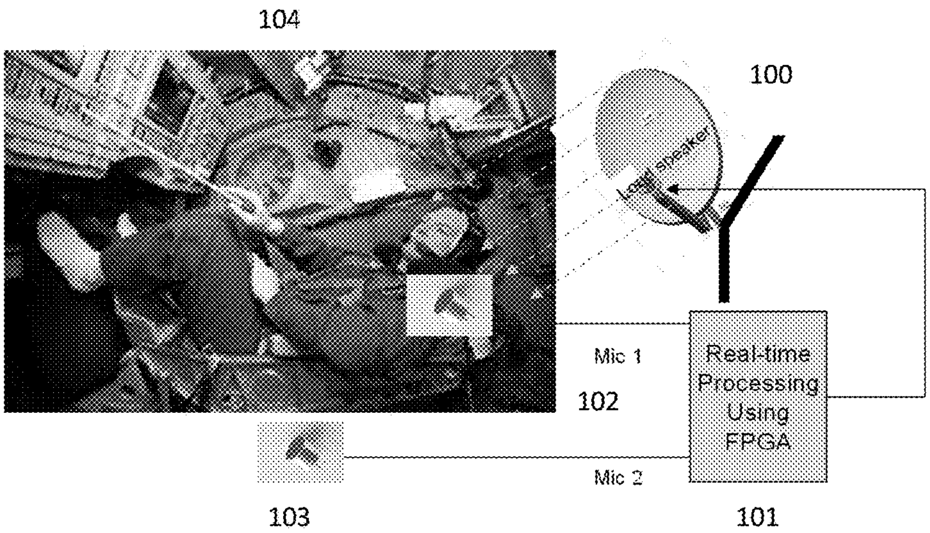
FIG. 1 is a schematic diagram of the active noise reduction system of the present invention.

As illustrated in the FIG. 1, the present invention provides a system for suppressing background noise near a user's head. In an embodiment, the system comprises a parabolic loud speaker 100, a FPGA 101, a first microphone 102 for measuring the noise level near an occupant's head, a second microphone 103 for measuring the background noise, and a cabin 104 to accommodate a user.

In an embodiment, the parabolic loud speaker 100 can be affixed to the cabin 104 wall, and is directed towards the user's head. The cabin 104 can be of an automobile, an aircraft, a spacecraft, or any other environment where a user is primarily situated in a fixed position. The parabolic loud speaker 100 can be alternatively fitted to a headrest of a user's chair. The parabolic loud speaker 100 is a directional speaker. The parabolic loud speaker 100 provides a focused noise-reducing signal to a small volume of space. In other words, the parabolic loud speaker 100 is used to generate the noise-reducing field. Another advantage of using a parabolic loud speaker 100 as compared to other speaker types known in the art is that the spillover of the noise-reducing signal will be small.

In an embodiment, the first microphone 102 is positioned near the user's head for receiving user's speaking voice, and the second microphone 103 is positioned to pick up background noise. In an embodiment, the second microphone 103 is provided in a circuit coupled to the digital signal processor (DSP). Both the first microphone 102 and the second microphone 103 can be coupled to the FPGA 101. In the present embodiment, an FPGA 101 is used as an ideal processor due to its short time delay in signal processing.

In an embodiment, the FPGA is configured to execute an adaptive filtering algorithm. The adaptive filtering algorithm comprises a frequency-domain-filtered-x least mean square with band selection (FD-FXLMS-BS) algorithm to generate an anti-phase signal according to the background noise received by the second microphone 103. The frequency domain technique saves computations by replacing the time-domain linear convolution by multiplication in the frequency domain. For each frequency component, there is a parameter for adaptive adjustment. Depending on applications, certain frequency bands can be selected for processing. For example, only bands between 250 Hz and 750 Hz can be selected for noise reduction, leaving most of the speech signals to pass through. This is a key advantage of the frequency domain approach with band selection. Based on various evaluations, FD-FXLMS-BS performs better than time domain FXLMS. The algorithm will be processed using the FPGA 101, which has minimum processing delay and is crucial for the success of active noise reduction.

After generating the anti-phase signal, the FPGA 101 transmits the anti-phase signal to the parabolic loud speaker 100. The parabolic loud speaker 100 will be used to generate the noise-reducing field according to the anti-phase signal for noise reduction, or a uniform sound field (180 degrees out of phase signal to cancel the background noise) covering the person's head. Due to the configuration and direction of the parabolic loud speaker 100, the uniform sound field covers the user's head to create a quiet zone, with a reduced noise level as compared to the environment.

In an embodiment, the system can be configured to select certain frequency bands for noise reduction, thereby giving users more flexibility in applications. Furthermore, the present invention allows users to selectively reduce noise in a cabin, while still allowing for the user to use audio communications with others.

Figure 2:
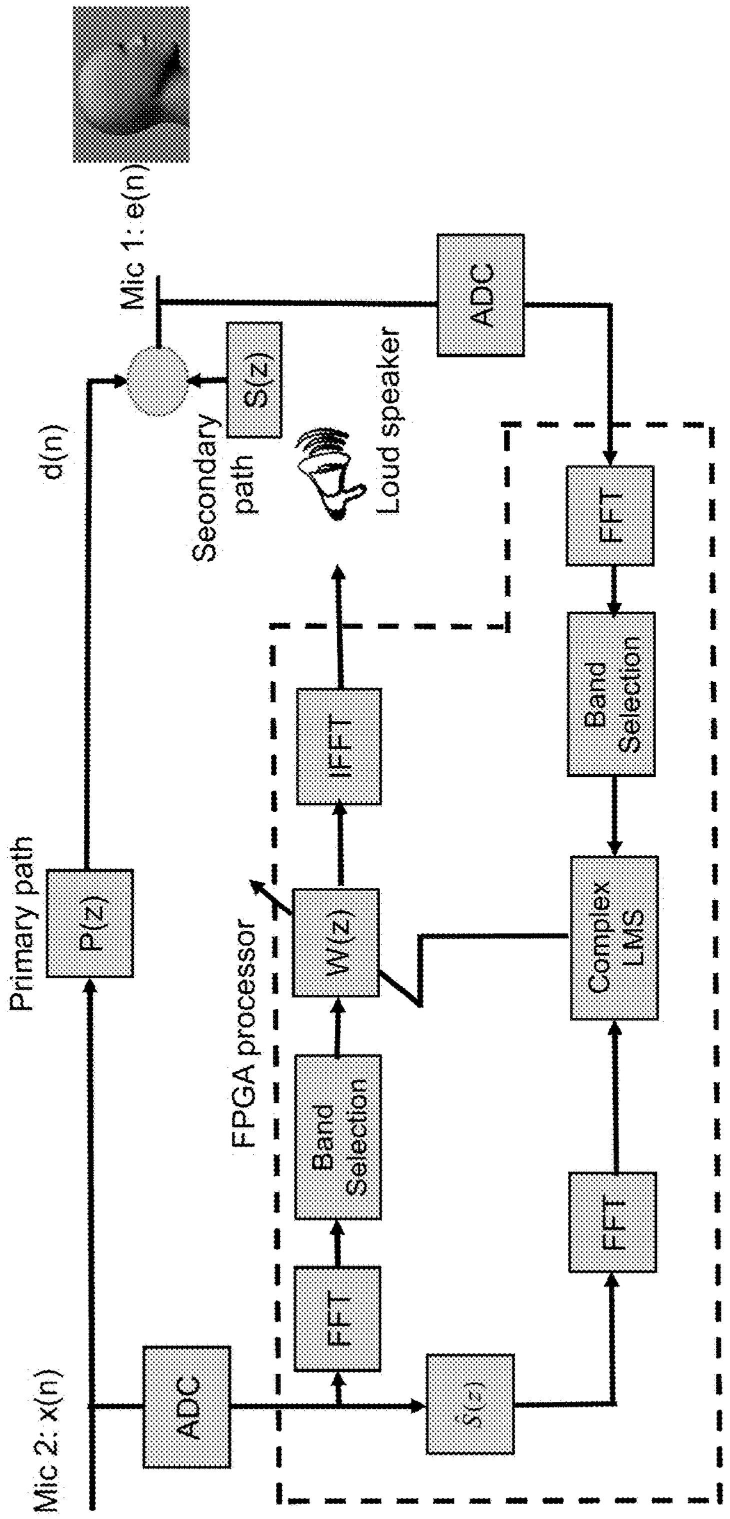
FIG. 2 is a schematic diagram of the signal flow of the present invention.

As shown in FIG. 2, the system comprises an FPGA to perform the FD-FXLMS-BS algorithm on the background noise signal received from the microphone to generate the anti-phase noise-reducing signal. FIG. 2 is an exemplary embodiment of the signal flow of the noise reduction system. In FIG. 2, the primary path (P(z)) represents the propagation path of the sound between the second microphone and the occupant's head, the secondary path (S(z)) represents the propagation path between the loudspeaker and the occupant's head. As shown in FIG. 2, the background noise (d(n)) from the second microphone is processed by an analog-to-digital converter (ADC) before being inputted to the FPGA processor. The first microphone, positioned near the occupant's head, receives the residual noise (e(n)), and e(n) is inputted to the FPGA after being processed by an ADC. Both the residual noise and background noise are fed into the adaptive filter (W(z)) to allow for an adjustment of the anti-phase signal to reduce the noise recorded by the first microphone.

Figure 3A:
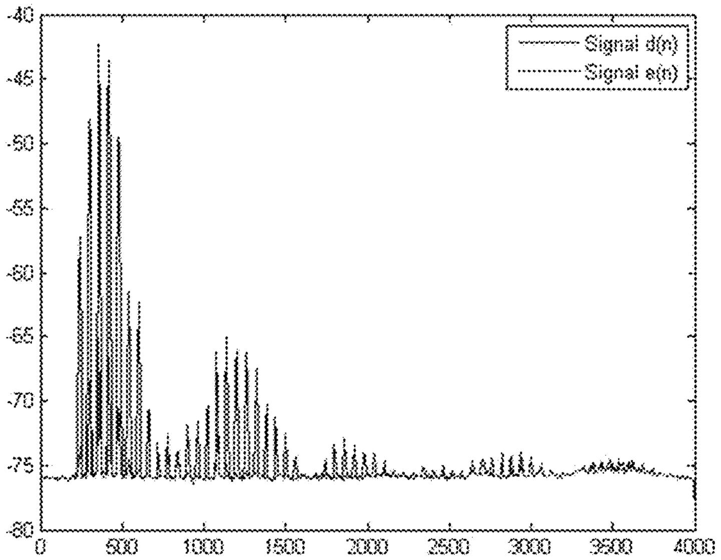
FIGS. 3A and 3B is a graph of the noise reduction of a narrowband noise using FD-FXLMS-BS.
Figure 3B:
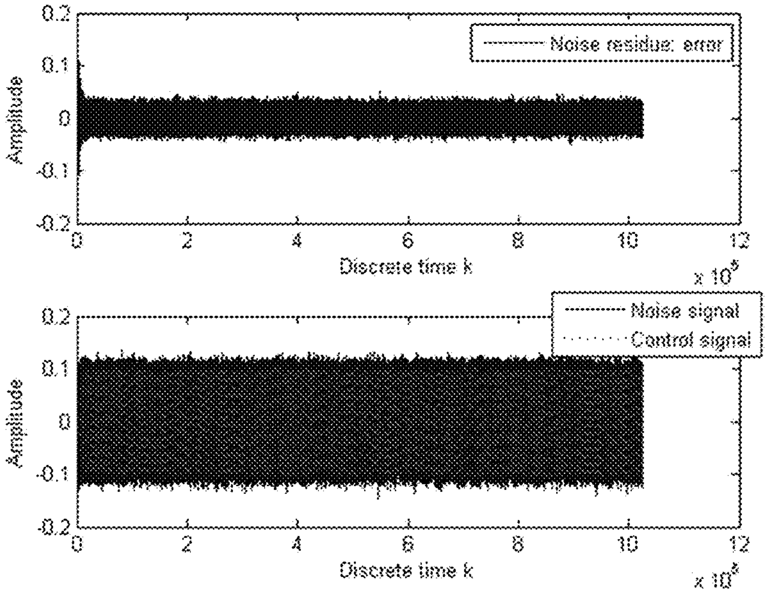

As shown in FIGS. 3A and 3B, the narrowband active noise cancellation results have an average noise attenuation of 14.36 db.

Figure 4:
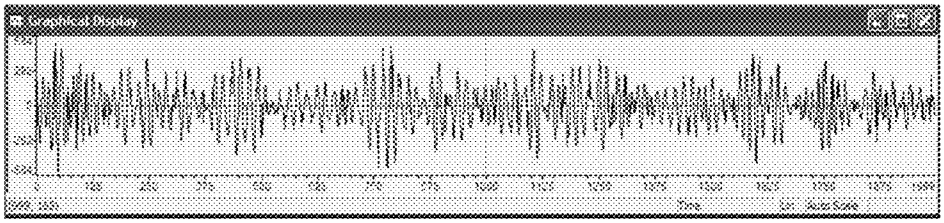
FIG. 4 is a graph of the first mic output (375 Hz to 625 Hz) without FD-FXLMS-BS control.
Figure 5:
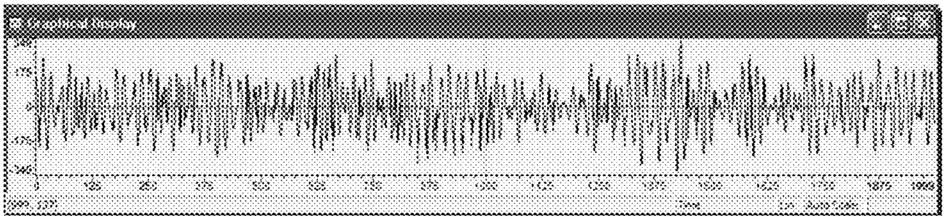
FIG. 5 is a graph of the first mic output (375 Hz to 625 Hz) with FD-FXLMS-BS control.

As shown in FIGS. 4 and 5, real-time experiments were performed to suppress narrowband noises in two frequency ranges: 375 Hz-625 Hz and 450-550 Hz. In FIG. 4 and FIG. 5, the narrowband noise reduction results are in the 375-625 Hz range. In FIG. 4, the first mic output is 584 without FD-FXLMS-BS control, and in FIG. 5 the first mic output is 349 with FD-FXLMS-BS control. This means the noise level near a person's head has been reduced significantly after applying FD-FXLMS-BS control. Therefore, the attenuation in the presence of the active noise cancellation of an embodiment of the present invention is 1.67 (584/249=1.67). In terms of decibel rating, the noise reduction is approximately 20 log(1.67)=4.45 db.

Figure 6:
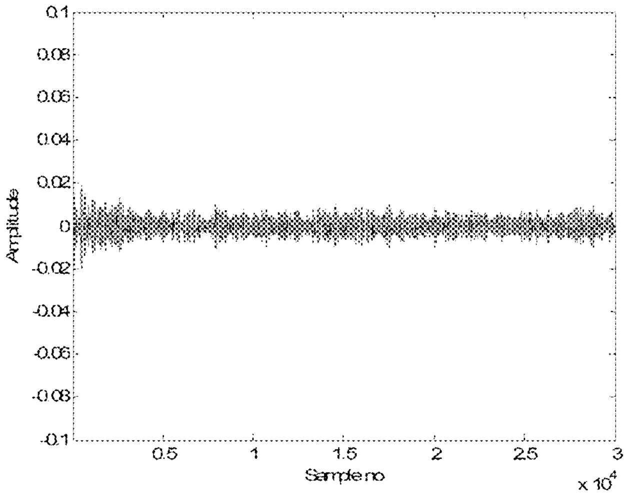
FIG. 6 is a graph of the first mic output (450 Hz to 550 Hz).

As shown in FIG. 6, in the 450-550 Hz range, the noise attenuation is from 0.02 to 0.01, which is twice the level of noise reduction. In terms of decibel rating, the noise reduction is about 6 db.

The foregoing description of the preferred embodiments is presented for purposes of illustration and description. It is not intended to be exhaustive or limit the invention to the precise form of the exemplary embodiments disclosed. Many modifications and variations will be apparent to those of ordinary skill in the art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims.

What is claimed is:

1. An active noise reduction system for blocking selected frequency bands near an occupant's head to create a quiet zone without the use of a headset in a cabin, comprising:

a first microphone, disposed adjacent to said occupant's head, for receiving a speaking voice of the occupant;

a second microphone, mounted on a wall in said cabin, for receiving a background noise;

a parabolic directional loud speaker, configured to generate a uniform sound field for eliminating said selected frequency bands, to reduce said background noise;

a Field Programmable Gate Array (FPGA) processor, for performing a Frequency Domain-Filtered X-Least Mean Square-Band Selection (FD-FX-LMS-BS) algorithm, electrically coupled to said first and second microphones and said parabolic directional loud speaker;

a first A-D converter for receiving said speaking voice, connected to said FPGA processor;

a second A-D converter for receiving said background noise, connected to said FPGA processor;

a first Fast Fourier Transform (FFT) module in said FPGA connected to said first A-D converter;

a second Fast Fourier Transform (FFT) module in said FPGA connected to said second A-D converter;

a first frequency band selector in said FPGA processor receives signals from said first FFT module;

a second frequency band selector in said FPGA processor receives signals from said second FFT module;

an adaptive filter for receiving signals from said first and second frequency band selectors, connected to said directional parabolic loud speaker to generate an anti-phase signal near the occupant's head;

a complex Least Mean Square (LMS) module connected to signals transmitted by said first frequency band selector and the background noise received by said second microphone; and an Inverse Fast Fourier Transform (IFFT) module connector between said adaptive filter and said directional parabolic loud speaker to produce said anti-phase signal.

2. The system of claim 1, wherein the selected frequency bands to be eliminated are between 250 Hz and 750 Hz.

* * * * *